(12) United States Patent
Baringer et al.

(10) Patent No.: US 10,110,247 B1
(45) Date of Patent: Oct. 23, 2018

(54) METHOD AND APPARATUS FOR TEMPERATURE COMPENSATION FOR DATA CONVERTERS FOR AUTOMOBILE APPLICATIONS

(71) Applicant: GM GLOBAL TECHNOLOGY OPERATIONS LLC, Detroit, MN (US)

(72) Inventors: Cynthia D Baringer, Piedmont, CA (US); Mohiuddin Ahmed, Moorpark, CA (US); Jongchan Kang, Moorpark, CA (US); James Chingwei Li, Simi Valley, CA (US); Emilio A Sovero, Thousand Oaks, CA (US); Timothy J Talty, Beverly Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/846,839

(22) Filed: Dec. 19, 2017

(51) Int. Cl.
| | |
|---|---|
| *H03M 7/00* | (2006.01) |
| *H03M 3/00* | (2006.01) |
| *H04B 17/20* | (2015.01) |
| *H03M 1/02* | (2006.01) |
| *H04B 1/16* | (2006.01) |
| *H04B 1/08* | (2006.01) |

(52) U.S. Cl.
CPC ............ *H03M 3/322* (2013.01); *H04B 17/20* (2015.01); *H04B 1/082* (2013.01); *H04B 1/16* (2013.01)

(58) Field of Classification Search
CPC ......... H03M 3/322; H04B 1/082; H04B 1/16; H04B 17/20
USPC .................................................. 341/143, 144
See application file for complete search history.

(56) References Cited

U.S. PATENT DOCUMENTS

| | | | |
|---|---|---|---|
| 6,218,972 B1* | 4/2001 | Groshong | ............ H04B 1/0003 341/143 |
| 2017/0328790 A1* | 11/2017 | Bach | .................... G01K 15/005 |

* cited by examiner

*Primary Examiner* — Lee Nguyen

(57) ABSTRACT

A method and apparatus for temperature compensation for data converters in a software defined radio. Specifically, the system and method are teach monitoring the temperature of critical signal processing components such as band pass filters, ADCs and DACs and retrieving modulator coefficients in response to the temperatures and the like. The modulator coefficients are then used to compensate for temperature changes, performance changes and the like.

20 Claims, 4 Drawing Sheets

METHOD AND APPARATUS FOR TEMPERATURE COMPENSATION FOR DATA CONVERTERS FOR AUTOMOBILE APPLICATIONS

BACKGROUND

The present application generally relates to wide bandwidth radio system designed to adapt to various global radio standards and, more particularly, to a cellular radio architecture that employs temperature compensation techniques for transmitter and receiver performance. The architecture is based on sigma delta modulator where temperature changes may affect center frequency shift, and transconductance value variation which are detrimental to the bandpass sigma delta modulate due to transfer function change, such as the noise transfer function.

DISCUSSION OF THE RELATED ART

Traditional cellular telephones employ different modes and bands of operation that have been supported in hardware by having multiple disparate radio front-end and baseband processing chips integrated into one platform, such as tri-band or quad-band user handsets supporting global system for mobile communications (GSM), general packet radio service (GPRS), etc. Known cellular receivers have integrated some of the antenna and baseband data paths, but nevertheless the current state of the art for mass mobile and vehicular radio deployment remains a multiple static channelizing approach. Such a static architecture is critically dependent on narrow-band filters, duplexers and standard-specific down-conversion to intermediate-frequency (IF) stages. The main disadvantage of this static, channelized approach is its inflexibility with regards to the changing standards and modes of operation. As the cellular communications industry has evolved from 2G, 3G, 4G and beyond, each new waveform and mode has required a redesign of the RF front-end of the receiver as well as expanding the baseband chip set capability, thus necessitating a new handset. For automotive applications, this inflexibility to support emerging uses is prohibitively expensive and a nuisance to the end-user.

Providing reliable automotive wireless access is challenging from an automobile manufacturers point of view because cellular connectivity methods and architectures vary across the globe. Further, the standards and technologies are ever changing and typically have an evolution cycle that is several times faster than the average service life of a vehicle. More particularly, current RF front-end architectures for vehicle radios are designed for specific RF frequency bands. Dedicated hardware tuned at the proper frequency needs to be installed on the radio platform for the particular frequency band that the radio is intended to operate at. Thus, if cellular providers change their particular frequency band, the particular vehicle that the previous band was tuned for, which may have a life of 15 to 20 years, may not operate efficiently at the new band. Hence, this requires automobile manufactures to maintain a myriad of radio platforms, components and suppliers to support each deployed standard, and to provide a path to upgradability as the cellular landscape changes, which is an expensive and complex proposition.

Delta-sigma modulators are becoming more prevalent in digital receivers because, in addition to providing wideband high dynamic range operation, the modulators have many tunable parameters making them a good candidate for reconfigurable systems. In particular, delta-sigma modulators include a software tunable filter for noise shaping an incoming RF signal. However delta sigma modulators used in automotive applications are susceptible to temperature changes which can alter performance. It would be desirable to overcome this temperature susceptibility in order to utilize the software programmable nature of the delta-sigma modulator to further reduce the processing load of a system digital signal processor,

SUMMARY

Embodiments according to the present disclosure provide a number of advantages. For example, embodiments according to the present disclosure may enable reception of control data for use by autonomous vehicle software, subsystems and the like. This system may further be employed to receive entertainment, audio, and video programming and is not limited to autonomous vehicles.

The present disclosure describes a method for temperature compensation in a software programmable radio comprising processing a first digital signal, the first digital signal having been demodulated according to a first modulator coefficient, receiving a first temperature measurement indicating a temperature of a first device for receiving an RF signal and a second temperature measurement indicating a temperature of a second device for receiving the RF signal, wherein the RF signal includes a first data, retrieving a second modulator coefficient corresponding to the temperature of the first device and the temperature of the second device, demodulating the RF signal in response to the second modulator coefficient to generate a second digital signal, and processing the second digital signal to extract the first data.

Another aspect of the present disclosure describes a method for receiving a first temperature measurement indicating a temperature of a first device for receiving an RF signal and a second temperature measurement indicating a temperature of a second device for receiving the RF signal, wherein the RF signal includes a first data, retrieving a modulator coefficient corresponding to the temperature of the first device and the temperature of the second device, demodulating the RF signal in response to the modulator coefficient to generate a digital signal, and processing the digital signal to extract the first data.

Another aspect of the present disclosure describes an apparatus comprising a first RF device for processing an RF signal, a first temperature sensor for measuring a temperature of the first RF device, a second RF device for processing the RF signal, a second temperature sensor for measuring a temperature of the second RF device, a memory for storing a modulation coefficient, a demodulator for demodulating the RF signal in response to the modulation coefficient to generate a digital signal, and a processor for retrieving the modulator coefficient in response to the temperature of the first RF device and the temperature of the second RF device and coupling the modulation coefficient to the demodulator, the processor being further operative to process the digital signal.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a cellular radio architecture is merely exemplary in nature, and is in no way intended to limit the invention or its applications or uses. For example, the radio architecture of the invention is described as having application for a vehicle. However, as will be appreciated by those skilled in the art, the radio architecture may have applications other than automotive applications.

The cellular radio architectures discussed herein are applicable to more than cellular wireless technologies, for example, WiFi (IEEE 802.11) technologies. Further, the cellular radio architectures are presented as a fully duplexed wireless system, i.e., one that both transmits and receives. For wireless services that are receive only, such as global positioning system (GPS), global navigation satellite system (GNSS) and various entertainment radios, such as AM/FM, digital audio broadcasting (DAB), SiriusXM, etc., only the receiver design discussed herein would be required. Also, the described radio architecture design will enable one radio hardware design to function globally, accommodating various global wireless standards through software updates. It will also enable longer useful lifespan of the radio hardware design by enabling the radio to adapt to new wireless standards when they are deployed in the market. For example, 4G radio technology developments and frequency assignments are very dynamic. Thus, radio hardware deployed in the market may become obsolete after just one or two years. For applications, such as in the automotive domain, the lifespan can exceed ten years. This invention enables a fixed hardware platform to be updateable through software updates, thus extending the useful lifespan and global reuse of the hardware.

Figure 1:
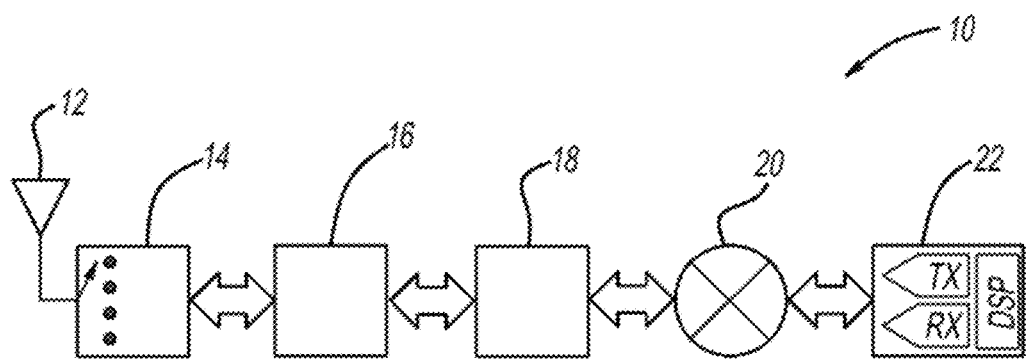
FIG. 1 shows a block diagram of a known multi-mode, multi-band cellular communications handset architecture.

FIG. 1 is a block diagram of a known multi-mode, multi-band cellular communications user handset architecture 10 for a typical cellular telephone. The architecture 10 includes an antenna structure 12 that receives and transmits RF signals at the frequency band of interest. The architecture 10 also includes a switch 14 at the very front-end of the architecture 10 that selects which particular channel the transmitted or received signal is currently for and directs the signal through a dedicated set of filters and duplexers represented by box 16 for the particular channel. Modules 18 provide multi-mode and multi-band analog modulation and demodulation of the receive and transmit signals and separates the signals into in-phase and quadrature-phase signals sent to or received from a transceiver 20. The transceiver 20 also converts analog receive signals to digital signals and digital transmit signals to analog signals. A baseband digital signal processor 22 provides the digital processing for the transmit or receive signals for the particular application.

Figure 2:
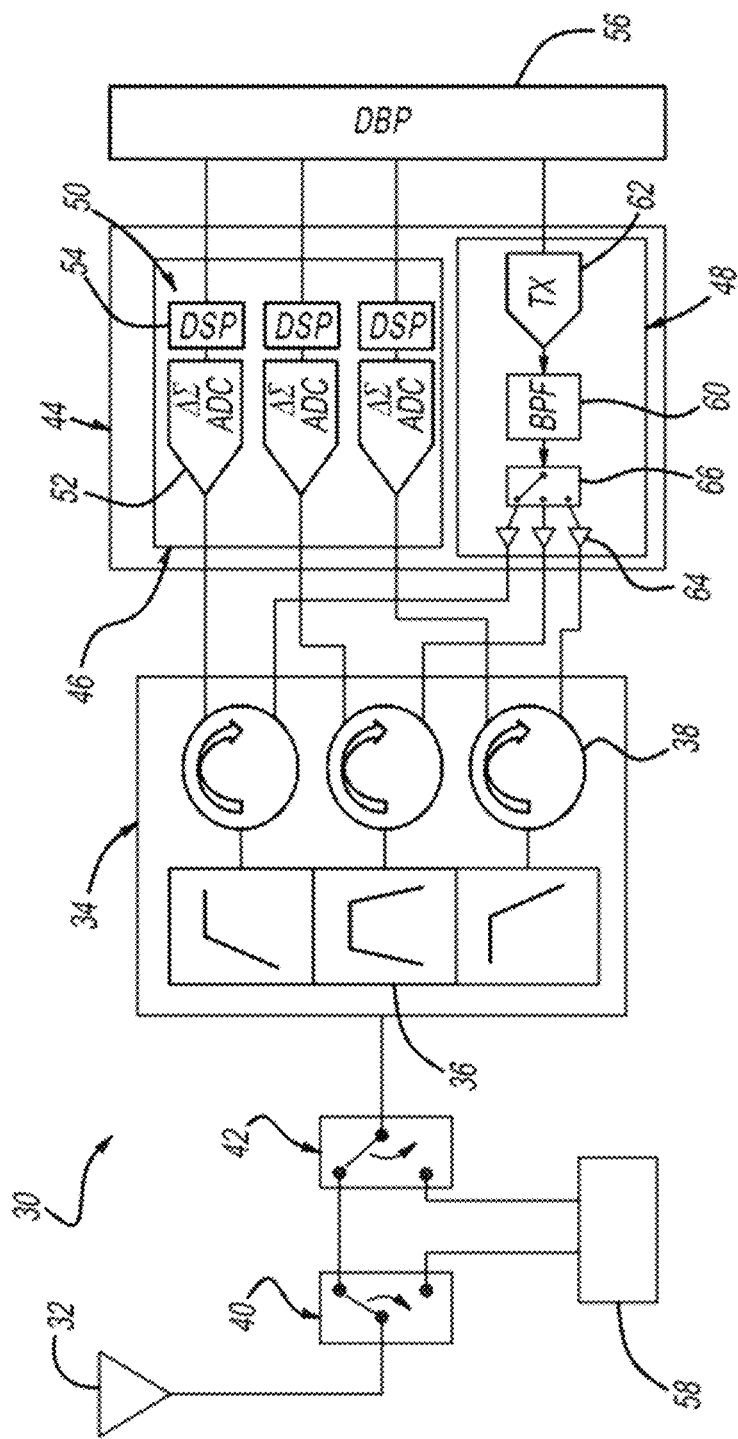
FIG. 2 shows a block diagram of a software-programmable cellular radio architecture applicable.

FIG. 2 is a schematic block diagram of a cellular radio front-end architecture 30 that provides software programmable capabilities as will be discussed in detail below. The architecture 30 includes an antenna structure 32 capable of receiving and transmitting the cellular frequency signals discussed herein, such as in a range of 400 MHz-3.6 GHz. Signals received and transmitted by the antenna structure 32 go through a multiplexer 34 that includes three signal paths, where each path is designed for a particular frequency band as determined by a frequency selective filter 36 in each path. In this embodiment, three signal paths have been selected, however, the architecture 30 could be expanded to any number of signal paths. Each signal path includes a circulator 38 that separates and directs the receive and transmit signals, and provides isolation so that the high power signals being transmitted do not enter the receiver side and saturate the receive signals at those frequency bands.

The architecture 30 also includes a front-end transceiver module 44 that is behind the multiplexer 34 and includes a receiver module 46 that processes the receive signals and a transmitter module 48 that processes the transmit signals. The receiver module 46 includes three receiver channels 50, one for each of the signal paths through the multiplexer 34, where a different one of the receiver channels 50 is connected to a different one of the circulators 38, as shown. Each of the receiver channels 50 includes a delta-sigma modulator 52 that receives the analog signal at the particular frequency band and generates a representative stream of digital data using an interleaving process in connection with a number of N-bit quantizer circuits operating at a very high clock rate, as will be discussed in detail below. As will further be discussed, the delta-sigma modulator 52 compares the difference between the receive signal and a feedback signal to generate an error signal that is representative of the digital data being received. The digital data bits are provided to a digital signal processor (DSP) 54 that extracts the digital data stream. A digital baseband processor (DBP) 56 receives and operates on the digital data stream for further signal processing in a manner well understood by those skilled in the art. The transmitter module 48 receives digital data to be transmitted from the processor 56. The module 48 includes a transmitter circuit 62 having a delta-sigma modulator that converts the digital data from the digital baseband processor 56 to an analog signal. The analog signal is filtered by a tunable bandpass filter (BPF) 60 to remove out of band emissions and sent to a switch 66 that directs the signal to a selected power amplifier 64 optimized for the transmitted signal frequency band. In this embodiment, three signal paths have been selected, however, the transmitter module 48 could be implemented using any number of signal paths. The amplified signal is sent to the particular circulator 38 in the multiplexer 34 depending on which frequency is being transmitted.

As will become apparent from the discussion below, the configuration of the architecture 30 provides software programmable capabilities through high performance delta-sigma modulators that provide optimized performance in the signal band of interest and that can be tuned across a broad range of carrier frequencies. The architecture 30 meets current cellular wireless access protocols across the 0.4-2.6 GHz frequency range by dividing the frequency range into three non-continuous bands. However, it is noted that other combinations of signal paths and bandwidth are of course possible. The multiplexer 34 implements frequency domain de-multiplexing by passing the RF carrier received at the antenna structure 32 into one of the three signal paths. Conversely, the transmit signal is multiplexed through the multiplexer 34 onto the antenna structure 32. For vehicular wireless access applications, such a low-cost integrated device is desirable to reduce parts cost, complexity, obsolescence and enable seamless deployment across the globe.

The delta-sigma modulators 52 may be positioned near the antenna structure 32 so as to directly convert the RF receive signals to bits in the receiver module 46 and bits to an RF signal in the transmitter module 48. The main benefit of using the delta-sigma modulators 52 in the receiver channels 50 is to allow a variable signal capture bandwidth and variable center frequency. This is possible because the architecture 30 enables software manipulation of the modulator filter coefficients to vary the signal bandwidth and tune the filter characteristics across the RF band, as will be discussed below.

The architecture 30 allows the ability to vary signal capture bandwidth, which can be exploited to enable the reception of continuous carrier aggregated waveforms without the need for additional hardware. Carrier aggregation is a technique by which the data bandwidths associated with multiple carriers for normally independent channels are combined for a single user to provide much greater data rates than a single carrier. Together with MIMO, this feature is a requirement in modern 4G standards and is enabled by the orthogonal frequency division multiplexing (OFDM) family of waveforms that allow efficient spectral usage.

The architecture 30 through the delta-sigma modulators 52 can handle the situation for precise carrier aggregation scenarios and band combinations through software tuning of the bandpass bandwidth, and thus enables a multi-segment capture capability. Dynamic range decreases for wider bandwidths where more noise is admitted into the sampling bandpass. However, it is assumed that the carrier aggregation typically makes sense when the user has a good signal-to-noise ratio, and not cell boundary edges when connectivity itself may be marginal. Note that the inter-band carrier aggregation is automatically handled by the architecture 30 since the multiplexer 34 feeds independent modulators in the channels 50.

The circulators 38 route the transmit signals from the transmitter module 48 to the antenna structure 32 and also provide isolation between the high power transmit signals and the receiver module 46. Although the circulators 38 provide significant signal isolation, there is some port-to-port leakage within the circulator 38 that provides a signal path between the transmitter module 48 and the receiver module 46. A second undesired signal path occurs due to reflections from the antenna structure 32, and possible other components in the transceiver. As a result, a portion of the transmit signal will be reflected from the antenna structure 32 due to a mismatch between the transmission line impedance and the antenna's input impedance. This reflected energy follows the same signal path as the incoming desired signal back to the receiver module 46.

The architecture 30 is also flexible to accommodate other wireless communications protocols. For example, a pair of switches 40 and 42 can be provided that are controlled by the DBP 56 to direct the receive and transmit signals through dedicated fixed RF devices 58, such as a global system for mobile communications (GSM) RF front-end module or a WiFi front-end module. In this embodiment, some select signal paths are implemented via conventional RF devices. FIG. 2 only shows one additional signal path, however, this concept can be expanded to any number of additional signal paths depending on use cases and services.

Delta-sigma modulators are a well-known class of devices for implementing analog-to-digital conversion. The fundamental properties that are exploited are oversampling and error feedback (delta) that is accumulated (sigma) to convert the desired signal into a pulse modulated stream that can subsequently be filtered to read off the digital values, while effectively reducing the noise via shaping. The key limitation of known delta-sigma modulators is the quantization noise in the pulse conversion process. Delta-sigma converters require large oversampling ratios in order to produce a sufficient number of bit-stream pulses for a given input. In direct-conversion schemes, the sampling ratio is greater than four times the RF carrier frequency to simplify digital filtering. Thus, required multi-GHz sampling rates have limited the use of delta-sigma modulators in higher frequency applications. Another way to reduce noise has been to use higher order delta-sigma modulators. However, while first order canonical delta-sigma architectures are stable, higher orders can be unstable, especially given the tolerances at higher frequencies. For these reasons, state of the art higher order delta-sigma modulators have been limited to audio frequency ranges, i.e., time interleaved delta-sigma modulators, for use in audio applications or specialized interleaving at high frequencies.

The filter characteristics of a Delta-Sigma modulator may effectively be modified in order to compensate for Doppler shift. Doppler shift occurs when the transmitter of a signal is moving in relation to the receiver. The relative movement shifts the frequency of the signal, making it different at the receiver than at the transmitter. An exemplary system according to the present disclosure leverages the software-defined radio architecture to quickly estimate a shift in the carrier frequency and re-center the filter before the signal is disrupted or degraded. In normal operation, the notch of the modulator filter is centered about the expected carrier frequency of the received signal with the signal band information centered around the carrier frequency and not exceeding the bandwidth of the modulator filter. A Doppler shift would offset the carrier by an amount $\Delta f$ causing potential degradation to signal content with an increase in noise at one side of the band. According to the method and system described herein, the transceiver in a wireless cellular communication system can adapt to changes in the RF carrier frequency and may maintain signal integrity, by shifting the filter notch by the same amount as the carrier frequency.

For the cellular application discussed herein that covers multiple assigned frequency bands, a transmitter with multi-mode and multi-band coverage is required. Also, many current applications mandate transmitters that rapidly switch between frequency bands during the operation of a single communication link, which imposes significant challenges to typical local oscillator (LO) based transmitter solutions. This is because the switching time of the LO-based transmitter is often determined by the LO channel switching time under the control of the loop bandwidth of the frequency synthesizer, around 1 MHz. Hence, the achievable channel switching time is around several microseconds, which unfortunately is too long for an agile radio. A fully digital PWM based multi-standard transmitter, known in the art, suffers from high distortion, and the channel switching time is still determined by the LO at the carrier frequency. A DDS can be used as the LO sourced to enhance the switching speed, however, this design consumes significant power and may not deliver a high frequency LO with low spurious components. Alternately, single sideband mixers can be used to generate a number of LOs with different center frequencies using a common phase-lock loop (PLL), whose channel switching times can be fast. However, this approach can only support a limited number of LO options and any additional channels to cover the wide range of the anticipated 4G bands would need extra mixtures. As discussed, sigma-delta modulators have been proposed in the art to serve as an RF transmitter to overcome these issues. However, in the basic architecture, a sigma-delta modulator cannot provide high dynamic range performance at high input frequencies due to a moderate clock frequency. It is precisely because the clock frequency is constrained by current technology that this high frequency mode of operations cannot be supported.

Figure 3:
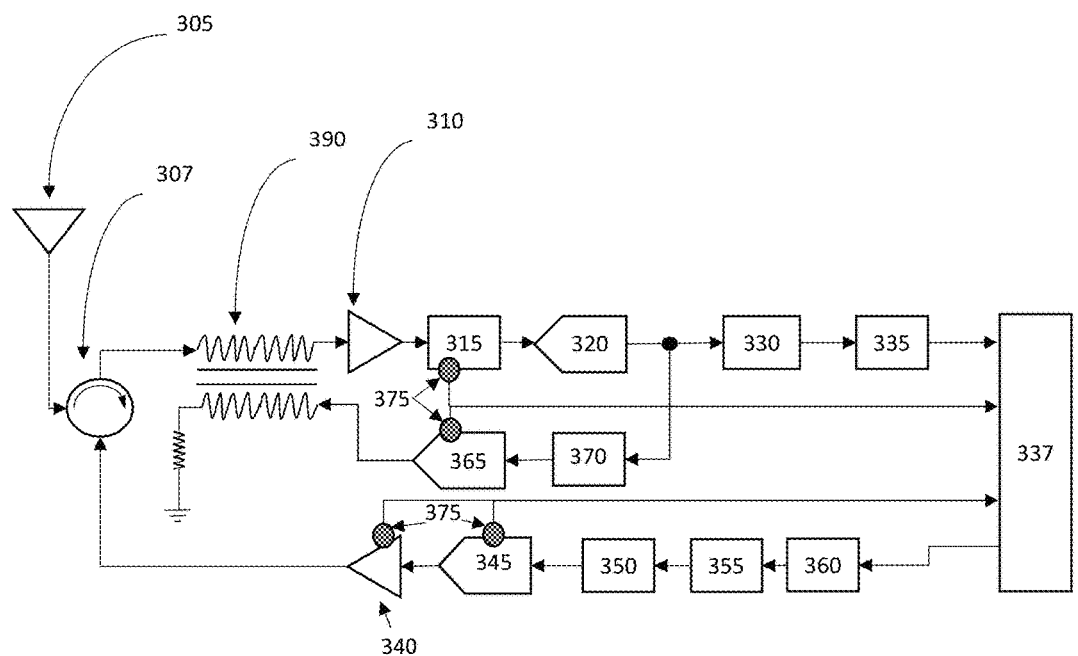
FIG. 3 shows an exemplary apparatus for temperature compensation for data converters in a software defined radio.

Turning now to FIG. 3, an exemplary system for temperature compensation for data converters 300 in a software defined radio is shown. The exemplary system employs an antenna 305, a circulator 307, a low noise transconductance amplifier (LNTA) 310, a bandpass filter 315, an analog to digital converter 320, a decoder 330, a demultiplexer 335, a digital signal processor (DSP) 337, a power amplifier 340, a first digital to analog converter 345, a first digital weighting average (DWA) 350, a delta sigma modulator 355, a multiplexer 360, a second digital to analog converter 365 a second DWA 370, a plurality of sensors 375 and a power combiner 390. The system is configured such that the input tunable resonators can simultaneously equalize and noise shape the incoming signals by incorporating a channel equalizer into a sigma delta data converter, thus, reducing processing requirements of the DSP 337.

The exemplary application is a cellular radio architecture based on direct conversion to baseband and direct basedband to RF conversion. This architecture employs a software controllable delta-sigma data converter coupled with a high performance duty-cycle modulated digital to analog converter that makes the direct conversion to/from digital baseband possible. The transmitter chain in particular uses the delta-sigma architecture to implement a 4 bit digital to analog (DAC) converter 320 design that converts digital modulated waveforms directly to RF bandpass output without the need for a power amplifiers for each band/carrier. Thus, for transmit operations; the device is capable of multiband, multimodal operations over a wide bandwidth with greater than 60 dB dynamic range while consuming power compatible for handset form factor.

However, in the exemplary application temperature variations will affect the component characteristics thereby altering the receiver and transmitter performance such as tank center frequency shift, transconductance value variation. Tunable sigma delta modulators are very sensitive to the environment variations because their noise transfer functions rely on these parameters and determine the achievable performance. These temperature induced changes are detrimental to the bandpass sigma delta modulator performance due to the transfer function change, especially the noise transfer function. In order to improve the performance of the software controllable delta-sigma data converter and overcome these limitations, the system is operative to detect the temperature and temperature variation across the modulator and adjust the modulator to achieve the target performance.

A problem with digital algorithms used to detect the non-idealities and calibrate them out is that these algorithms tend to be computation heavy and mandate long processing time and high power consumption, which the modulator cannot afford during operation, especially when the modulator needs to continuously operate for a long time. The exemplary system leverages analog sensors 375, such as temperature sensors, process sensors, or supply voltage sensors, to monitor the working environment of the sigma delta modulator and conduct on-line calibration of the modulator to ensure a high performance.

In this exemplary embodiment, sensors 375 are strategically placed on susceptible components such as bandpass filters, DACs and power amplifiers. Temperature sensors to monitor the temperature of these components and the measurements are coupled back to the DSP 337 for analysis. These measurements are then used to anticipate transistor performance variation with temperature and proactively adjust delta sigma modulator parameters to ensure performance and stability.

Figure 4:
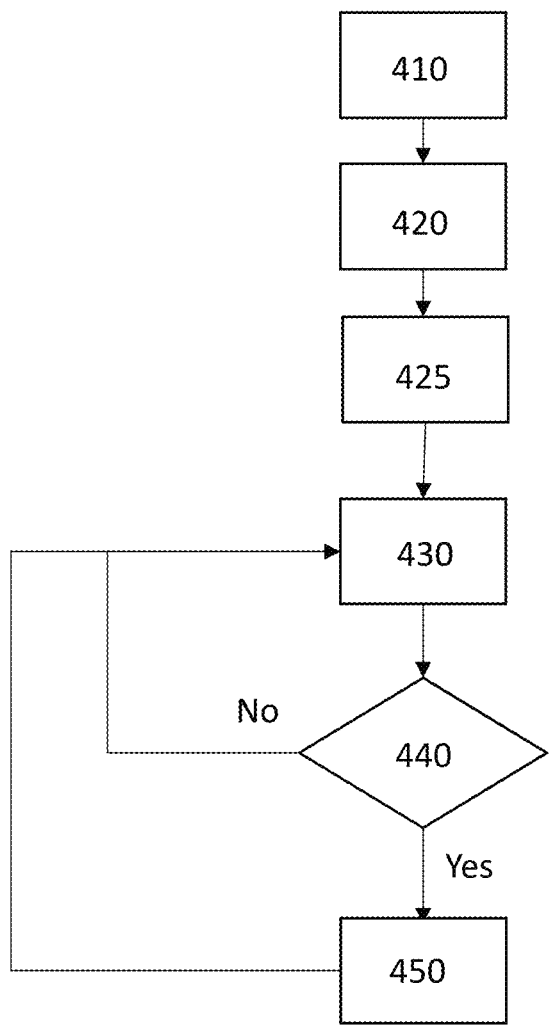
FIG. 4 shows an exemplary method for temperature compensation for data converters in a software defined radio.

Turning now to FIG. 4, an exemplary method for temperature compensation for data converters 400 in a software defined radio is shown. The proposed method is first operative to read process sensors, temperature sensors, and supply sensors information 410. The method then retrieves the corresponding codes from a preset table to configure the modulator 420. The tables store modulator coefficients for different device temperatures, supplies and processes. The modulator coefficients are applied to the appropriate devices 425. The method then rereads the process, temperature and supply sensors 430. The method is then operative to determine if there has been a change in any of the readings 440. If no changes are determined, the method then rereads the sensors after a period of time 430. If a change is detected, the system retrieves new corresponding codes from the preset table and reconfigures the modulator 450. The method then rereads the sensors after a period of time 430. The monitoring process continues in this manner with periodic monitoring of the sensor readings.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method comprising:
  receiving a first temperature measurement indicating a temperature of a first device for receiving an RF signal and a second temperature measurement indicating a temperature of a second device for receiving the RF signal, wherein the RF signal includes a first data;
  retrieving a modulator coefficient corresponding to the temperature of the first device and the temperature of the second device;
  demodulating the RF signal in response to the modulator coefficient to generate a digital signal; and
  processing the digital signal to extract the first data.

2. The method of claim 1 wherein the modulator coefficient is retrieved in response to an expected Doppler shift.

3. The method of claim 1 wherein the first device is a bandpass filter.

4. The method of claim 1 wherein the second device is a low noise amplifier.

5. The method of claim 1 wherein the second device is a low noise transconductance amplifier.

6. The method of claim 1 wherein the modulator coefficient is retrieved in response to a performance metric generated in response to the processing of the digital signal.

7. The method of claim 1 further comprising determining a performance metric of a demodulator and requesting the first temperature measurement and the second temperature measurement in response to the performance metric.

8. An apparatus comprising:
a first RF device for processing an RF signal;
a first temperature sensor for measuring a temperature of the first RF device;
a second RF device for processing the RF signal;
a second temperature sensor for measuring a temperature of the second RF device;
a memory for storing a modulation coefficient;
a demodulator for demodulating the RF signal in response to the modulation coefficient to generate a digital signal; and
a processor for retrieving the modulator coefficient in response to the temperature of the first RF device and the temperature of the second RF device and coupling the modulation coefficient to the demodulator, the processor being further operative to process the digital signal.

9. The apparatus of claim 8 wherein the modulator coefficient is retrieved in response to an expected Doppler shift.

10. The apparatus of claim 8 wherein the first RF device is a bandpass filter.

11. The apparatus of claim 8 wherein the second RF device is a low noise amplifier.

12. The apparatus of claim 8 wherein the second RF device is a low noise transconductance amplifier.

13. The apparatus of claim 8 wherein the modulation coefficient is retrieved in response to a performance metric generated in response to the processing of the digital signal.

14. The apparatus of claim 8 further comprising determining a performance metric of the processor and requesting the first temperature measurement and the second temperature measurement in response to the performance metric.

15. A method for temperature compensation in a software programmable radio comprising:
processing a first digital signal, the first digital signal having been demodulated according to a first modulator coefficient;
receiving a first temperature measurement indicating a temperature of a first device for receiving an RF signal and a second temperature measurement indicating a temperature of a second device for receiving the RF signal, wherein the RF signal includes a first data;
retrieving a second modulator coefficient corresponding to the temperature of the first device and the temperature of the second device;
demodulating the RF signal in response to the second modulator coefficient to generate a second digital signal; and
processing the second digital signal to extract the first data.

16. The method of claim 15 wherein the demodulating is performed by a delta sigma modulator.

17. The method of claim 15 wherein the first device is a bandpass filter.

18. The method of claim 15 wherein the second device is a low noise amplifier.

19. The method of claim 15 wherein the second device is a low noise transconductance amplifier.

20. The method of claim 15 wherein the modulator coefficient is retrieved in response to a performance metric generated in response to the processing of the first digital signal.

* * * * *